(12) United States Patent
Inao et al.

(10) Patent No.: US 7,129,779 B2
(45) Date of Patent: Oct. 31, 2006

(54) SEMICONDUCTOR DEVICE WITH FLOATING BLOCK

(75) Inventors: Masashi Inao, Ibaraki (JP); Hiroki Matsunaga, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/048,732

(22) Filed: Feb. 3, 2005

(65) Prior Publication Data
US 2005/0189603 A1  Sep. 1, 2005

(30) Foreign Application Priority Data

Feb. 4, 2004  (JP) .............................. 2004-027419
Jan. 6, 2005  (JP) .............................. 2005-001038

(51) Int. Cl.
*H03F 1/00*  (2006.01)

(52) U.S. Cl. ................. 330/250; 330/252; 330/253; 330/300; 257/197; 257/206; 257/207; 257/208

(58) Field of Classification Search ................ 330/250, 330/252, 253, 264, 277, 300, 127; 257/197, 257/206, 207, 208
See application file for complete search history.

(56) References Cited

FOREIGN PATENT DOCUMENTS

JP    2000-260981    9/2000

*Primary Examiner*—Nathan J. Flynn
*Assistant Examiner*—Tan Tran
(74) *Attorney, Agent, or Firm*—Steptoe & Johnson LLP

(57) ABSTRACT

A band gap circuit using NPN transistors (10, 12) having collectors connected to a power source voltage is employed, and transistor active regions of the NPN transistors (10, 12) and semiconductor elements constituting other signal processing circuits are integrated in the same floating block (19) with high voltage resistance. As a result, a reference voltage circuit used in the signal processing circuit can be integrated in a compact manner.

4 Claims, 7 Drawing Sheets

SEMICONDUCTOR DEVICE WITH FLOATING BLOCK

BACKGROUND OF THE INVENTION

1. Field of the Invention

The present invention relates to a sustain driver for applying a discharge sustain pulse voltage to electrodes of a plasma display panel.

2. Description of the Related Art

Plasma display devices, as shown in FIG. 4, comprise a PDP 101, a sustain driver 102, a scan driver 103, a data driver 104, and a panel control unit 105.

In the PDP 101 with a three-electrode surface discharge structure, address electrodes A are arranged in the vertical direction of the panel on a rear-surface substrate, and sustain electrodes X and scanning electrodes Y are arranged alternately in the transverse direction of the panel on the rear-surface substrate.

The sustain electrodes X are connected to each other and have substantially the same potential. The potential of the address electrodes A and scanning electrodes Y can be varied by one electrode at a time with the data driver 104 and scan driver 103.

Discharge cells P are provided in the intersection points of address electrodes A and electrode pairs composed of adjacent sustain electrodes X and scanning electrodes Y. A gas is sealed inside each discharge cell P. A dielectric layer, a protective layer for protecting the electrodes and dielectric layer, and a fluorescent layer comprising a fluorescent substance are provided on the surface of discharge cells P.

In the fluorescent layer, fluorescent substances emitting fluorescence of RGB colors is pasted in each discharge cell, and each discharge cell constitutes a sub-pixel cell of one color of RGB. Sub-pixels of three colors of RGB constitute one pixel.

The sustain driver 102 drives all the sustain electrodes X of the PDP 101 at the same time and outputs a discharge sustain pulse voltage which is periodically repeated for the prescribed interval.

The scan driver 103 individually changes each potential of scan electrodes Y of the PDP 101. In particular, it applies the scan pulse voltage in the prescribed order to the scan electrodes Y.

The data driver 104 individually changes each potential of the address electrodes A of the PDP 101. In particular, it stores a video signal for each line, selects an address electrode A in a row where the sub-pixels that have to emit light are located, and applies the address pulse voltage to the selected address electrode.

The panel control unit 105 controls the timing of pulse voltages produced by the sustain driver 102, scan driver 103, and data driver 104.

Because a high output voltage level is required for the sustain driver 102, the circuit thereof is composed by using elements with a high voltage resistance. Furthermore, in order to increase the power source efficiency of the circuit, a boot strap circuit is often employed for returning the output amplitude to the power source line of the control circuit so that the circuit functions effectively only when the output voltage waveform is at a high level.

FIG. 5 shows the sustain driver 102 comprising a boot strap circuit. The connection point OUT of output MOS transistors 36, 37 is connected to sustain electrodes X.

Here, the sustain driver 102 is composed of an integrated semiconductor device. A power source terminal VCC, a ground terminal GND, a high-potential power source terminal VB, an output terminal HO, and a low-potential terminal VS are the external terminals of the semiconductor device. An input circuit 1, a level shift circuit 2, a signal reception circuit 3, a reference voltage circuit 20, a protection circuit 7, and an output circuit 18 are integrated inside the semiconductor device.

An island region constituting a floating block 19 with a high voltage resistance is connected to a high-potential power source terminal VB, which is at a highest potential in the semiconductor device and is higher than the potential of the power source terminal VCC, and the floating block is biased to this highest potential. The signal reception circuit 3, reference voltage circuit 20, protection circuit 7, and output circuit 18 are included in the element formation region in the floating block 19 with a high voltage resistance.

In such a sustain driver 102, an input signal HIN, which is inputted from the outside, is received via the input circuit 1, the level shift circuit 2 shifts the output signal level of the input circuit 1 and transmits it to the signal reception circuit 3 located in the floating block 19 with a high voltage resistance.

The signal reception circuit 3 conducts shaping of the pulse waveform. The output circuit 18 is a circuit for expanding the output current performance and serves as a power amplifier of the output signal of the signal processing circuit. The sustain driver 102 also conducts a high-speed switching drive of the gate of the output MOS transistor 36 connected to the output terminal HO.

The reference voltage circuit 20 is composed of a serial circuit of a diode-connected MOS transistor 22 having a drain and a gate commonly connected and a resistor 21 connected between the drain of the transistor and the high-potential power source terminal VB. The voltage between the source and drain of the MOS transistor 22 is picked up as the reference voltage Vref. This reference voltage is equal to the threshold voltage Vt of the MOS transistor 22.

The protection circuit 7 performs resistance division of the voltage between the high-potential power source terminal VB and low-potential power source terminal VS by the resistors 5, 6 and monitors the abnormality of the power source voltage (voltage between the high-potential power source terminal VB and low-potential power source terminal VS) inside the floating block 19 with a high voltage resistance by comparing the resistance divided potential with the drain potential of the MOS transistor with a comparator 4.

Further, a wired AND circuit is constituted by connecting the output terminal of the comparator 4 to the input terminal of the output circuit 18. As a result, if the power source voltage of the floating block 19 with a high voltage resistance abnormally increases, the output of the comparator 4 assumes a low level, the input of the output circuit 18 is shielded, and the operation of the output circuit 18 is terminated. Further, the application of excessively high voltage to the power transistor constituting the output circuit 18 or output MOS transistor 36, 37 externally connected to the output terminal HO is prevented and those transistors are protected from breakdown.

The output MOS transistor 37 is controlled via an input circuit 40, a signal processing circuit 41, and an output circuit 42 based on the input signal LIN inputted from the outside.

While the output MOS transistor 37 is ON in the circuit shown in FIG. 5, a voltage lowered by VF≈0.7 V of a diode 38 is applied from the low-potential power source VCC to a capacitor 39. While the output MOS transistor 36 is ON, the voltage on the VS terminal rises almost to the HV voltage and, the high-voltage power source VB becomes at "VS+VCC−0.7" V. The high-voltage power source VB varies depending on the ON time of the output MOS transistors 36, 37 and capacitance of the capacitor 39.

For this reason, the circuit operates in a state in which the power source voltage of the control circuit fluctuates, and if the surge voltage is superimposed on the power source voltage, there is a risk of the control circuit being damaged. Moreover, there is also a risk of the output MOS transistors 36, 37 being damaged.

For this reason, a protection operation function against the surge voltage superimposed on the power source voltage is also required. A stable reference voltage source is necessary to demonstrate this protection operation function with high stability.

The configuration shown in FIG. 5 uses a simple reference voltage circuit 20 composed of a serial circuit of a MOS transistor 22 and a resistor 21, and the reference voltage Vref depends on the threshold voltage Vt of the MOS transistor 22. The value of the threshold voltage Vt of the MOS transistor 22 differs because of a spread occurring in the manufacture of MOS transistors or has inherent dependency on temperature. As a result, the detection sensitivity of the protection circuit 7 is different for each semiconductor device, or the detection sensitivity changes depending on the ambient temperature, and the circuit operation of the semiconductor device is difficult to ensure.

Accordingly, even if the number of MOS transistors constituting the circuit is increased and a linear circuit (reference voltage circuit) with a stable temperature characteristic and a small spread is designed, the mutual spread of electric characteristics between the MOS transistors contained in the semiconductor device is large. As a result, the spread cannot be decreased to a level of linear circuits composed of bipolar transistors.

Further, generally, in the case of semiconductor devices composed of bipolar transistors, a mutual spread between the bipolar transistors is small. As a result, the accuracy is good and a reference voltage circuit 20 with a small spared of absolute values can be easily constituted. However, if the consideration is based on the assumption that the sustain drive 102 is integrated in the semiconductor device, then a high voltage resistance characteristic of 400 V or higher is required for the bipolar transistors used in the sustain driver 102 and bipolar transistors for a high voltage resistance have to be used.

A problem associated with bipolar transistors with a high voltage resistance is that a guard ring has to be formed inside the island region forming the transistor, and the unit shape becomes larger than that of the usual bipolar transistor. This issue will be described hereinbelow.

FIG. 6A shows a plan view configuration of the floating block 19 with a high voltage resistance that is formed in a semiconductor substrate. FIG. 6B is a plan view of an NPN bipolar transistor. FIGS. 6A and 6B have the same enlargement ratio.

As shown in FIG. 6B, the outermost periphery of the NPN bipolar transistor is electrically separated by a separation and diffusion region 23 in order to cause the NPN bipolar transistor to function as a unit element. The main portion providing for the transistor action of the NPN bipolar transistor is a transistor active region 24 located in the center of a transistor island region. A collector diffusion layer, a base diffusion layer, an emitter diffusion layer, and electrodes connected thereto (not shown in the figures) are formed in the transistor active region 24. As for the element voltage resistance of the NPN bipolar transistor, a high voltage resistance characteristic is ensured by forming guard rings 25a, 25b, 25c between the transistor active region 24 and separation and diffusion region. In order to ensure even higher voltage resistance, the number of guard rings has to be increased and a large surface area for forming the guard rings is necessary around the transistor active region 24.

The floating block 19 with a high voltage resistance is formed in the island region formed by an N-type semiconductor, as shown in FIG. 6A. Semiconductor elements such as MOS transistors, resistors, and capacitors are integrated in the central part thereof, those element guard groups are formed in the element formation region 26 (a size of about 200 µm×400 µm), a guard ring region with a width of about 100 µm is provided around the element formation region 26, and a separation and diffusion region 27 is formed on the outermost periphery. As a result, the floating block 19 with a high voltage resistance has a size of about 400 µm×600 µm.

The floating block 19 with a high voltage resistance is also provided with guard rings 28a, 28b, 28c between the element formation region 26 and the separation and diffusion region 27, the entire element formation region 26 is tied up, and voltage resistance is increased. The necessity of providing guard rings on the peripheral portion of the element formation region 26 with the object of increasing the voltage resistance of elements was disclosed in Japanese Patent Application Laid-open No. H6-21358.

Further, in order to configure a stable reference voltage circuit, at least two NPN bipolar transistors are required, and a plurality of guard rings are necessary in the element region of the NPN bipolar transistors with a high voltage resistance in order to obtain a configuration composed of NPN bipolar transistors with a high voltage resistance that are separated from the peripheral portion and act independently. Moreover, the guard ring region where the guard rings are disposed is required to have a surface area that increases with the increase in the required voltage resistance. For example, as shown in FIG. 6B, in the area necessary for forming one NPN bipolar transistor having a voltage resistance of about 400 V, the size of the transistor active region 24, which is the main portion responsible for transistor operation, is about 40 µm×60 µm, and the width of the guard ring region where three guard rings are formed is about 100 µm.

More specifically, as shown in FIG. 7, in order to stabilize the reference voltage circuit 20, the NPN bipolar transistors 23A, 23B are disposed on the outside of the floating block 19 with a high voltage resistance. Therefore, a large surface area is necessary and the degree of integration of the semiconductor device is decreased.

As described hereinabove, when a reference voltage circuit 20 with a simple circuit configuration shown in FIG. 5 was employed, the problem was that the production spread of the resistor 21 or MOS transistor 22 was large, in particular, the spread in the threshold voltage Vt of the MOS transistor 22 degraded the detection accuracy of the protection circuit 7 and sufficient electric characteristics of the semiconductor device could not be guaranteed. For all that, in the case of forming a circuit by using a large number of MOS transistors, a sufficient accuracy of relative values of the MOS transistors cannot be obtained and a circuit design ensuring absolute values of detection accuracy of the protection circuit 7 is difficult to provide.

When bipolar transistors with good accuracy of relative values are used, it is possible to configure a reference voltage circuit that can ensure the absolute value of the operating voltage. However, the problem is that bipolar transistors with a high voltage resistance characteristic are required for integrating the sustain drive 102, and configuring the circuit by using bipolar transistors with a high voltage resistance that comprise guard rings degrades the degree of integration of the semiconductor device.

It is the first object of the present invention to resolve the above-described problems and to provide a semiconductor device that can be integrated without using bipolar transistors with a high voltage resistance that comprise guard rings.

It is the second object of the present invention to provide a semiconductor device with a high voltage resistance that has incorporated therein a protection circuit capable of ensuring stable circuit operation.

SUMMARY OF THE INVENTION

A semiconductor device of claim 1 of the present invention comprises a high-potential power source terminal to which a power source voltage varying from a low potential to a high potential is applied, a floating block which is configured as an island by surrounding a semiconductor layer formed on a semiconductor substrate with a separation and diffusion region, the potential of the island being biased by the voltage of said high-potential power source terminal, a MOS transistor having a source connected to a low-potential power source terminal and outputting a reference voltage between the high-potential power source terminal and a drain, first and second bipolar transistors having collectors and bases connected to the high-potential power source terminal, a first resistor connected between the emitter of the first bipolar transistor and the drain of the MOS transistor, second and third resistors connected in series between the emitter of the second bipolar transistor and the drain of the MOS transistor, and a differential amplifier for controlling the conduction of the MOS transistor by comparing the intermediate connection point of the second and third resistors and the emitter potential of the first bipolar transistor, wherein the transistor active region of the first and second bipolar transistors, the MOS transistor, and the first to third resistors are formed in the floating block.

The semiconductor device described in claim 2 of the present invention is the semiconductor device according to claim 1, wherein the floating block has the central portion thereof as an element formation region, guard rings are formed so as to surround the outer periphery of the element formation region, and the first and second bipolar transistors, the MOS transistor, and the first to third resistors are formed in the element formation region.

The semiconductor device described in claim 3 of the present invention is the semiconductor device according to claim 1 or 2, comprising fourth and fifth resistors connected in series between the low-potential power source terminal and the high-potential power source terminal, and a comparator for comparing the drain potential of the MOS transistor and the potential of the intermediate connection point created by the fourth and fifth resistors, wherein the output signal of a signal processing circuit integrated in the element formation region inside the floating block is terminated by the output of the comparator.

The semiconductor device described in claim 4 of the present invention is the semiconductor device according to claim 1, comprising a third bipolar transistor in which a constant-current source is connected to the emitter, and the collector and base are connected to the high-potential power source terminal, and a second comparator for comparing the voltage between the base and emitter of the third bipolar transistor with the prescribed voltage based on the reference voltage, wherein the output signal of a signal processing circuit integrated in the element formation region inside the floating block is terminated by the output of the second comparator.

With such a configuration, bipolar transistors with commonly connected collectors and bases can configure a reference voltage circuit in a state in which they are connected to a high-potential power source terminal. As a result, transistor active regions of bipolar transistors using no separation and diffusion region can be formed inside the region of a floating block to which the high-potential power source terminal is connected. Therefore, the guard rings for the first and second bipolar transistors can be commonly used with the guard rings for the signal processing circuit, bipolar transistors can be integrated inside the floating block and a highly accurate reference voltage can be outputted when the surface area is small.

Connecting the fourth and fifth resistors in series between the high-potential power source terminal and low-potential power source terminal and comparing the intermediate connection point thereof with the reference voltage with the comparator makes it possible to detect with good stability the power source fluctuations of the power source voltage (voltage between the high-potential power source terminal and low-potential power source terminal) of the signal processing circuit integrated in the floating block and to ensure stable operation of the integrated signal processing circuit.

When the power source voltage decreases and is above the power source voltage at which the control circuit operates normally, the output MOS transistor or insulated gate bipolar transistor serving as a switching element externally connected to the output terminal is terminated and breakdown caused by abnormal operation during power source voltage decrease can be prevented.

The breakdown caused by rising ambient temperature can be prevented by providing a second comparator for comparing the voltage between the base and emitter of the third bipolar transistor with the prescribed voltage based on the reference voltage when the ambient temperature rises above the allowed operation range and terminating the output signal of the signal processing circuit integrated in the element formation region in the floating block by the output of this comparator.

DESCRIPTION OF THE PREFERRED EMBODIMENTS

The embodiments of the present invention will be described below with reference to FIGS. 1 to 3.

(Embodiment 1)

Figure 1:
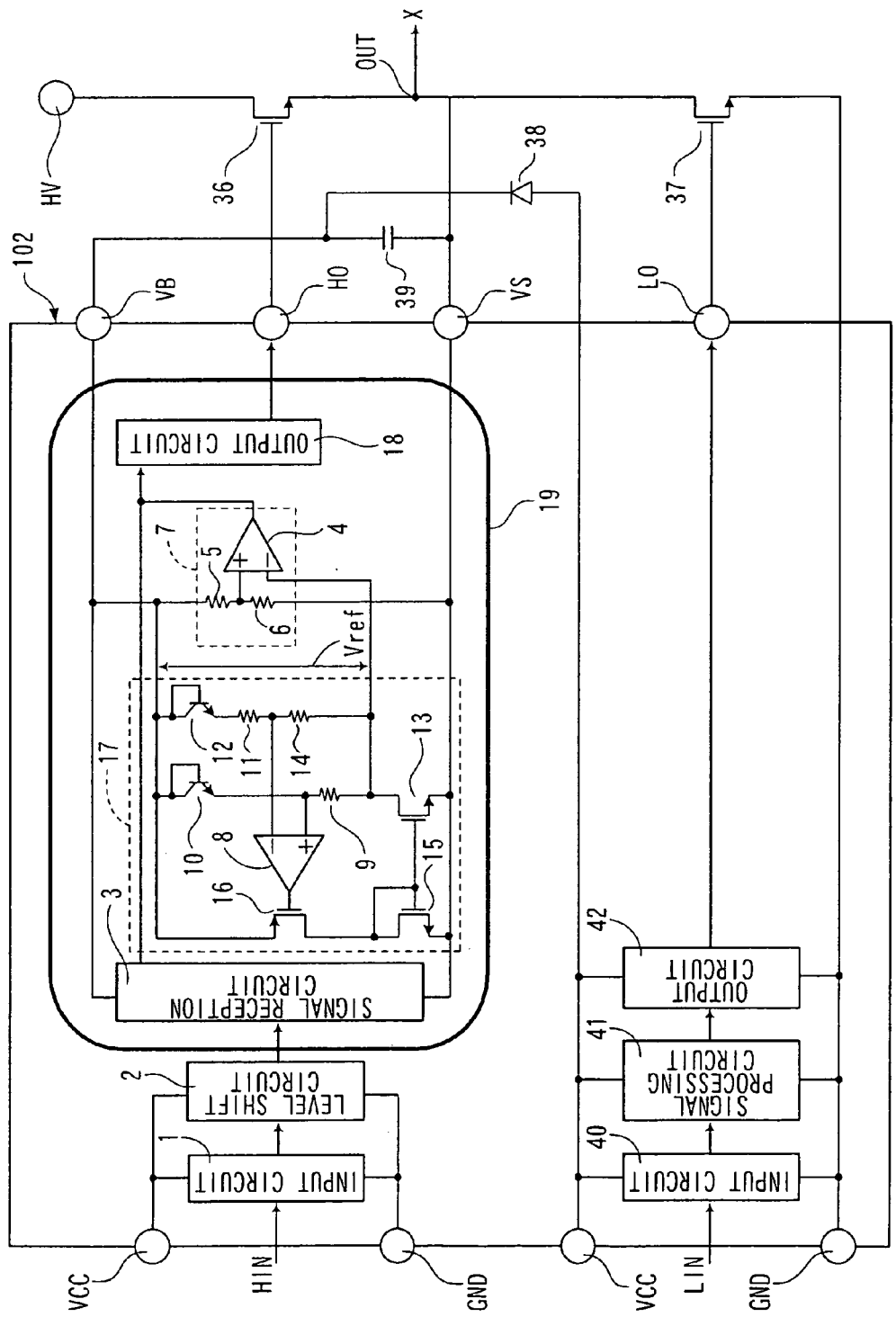
FIG. 1 is a circuit diagram of a semiconductor device for a sustain drive according to (Embodiment 1) of the present invention.
Figure 2:
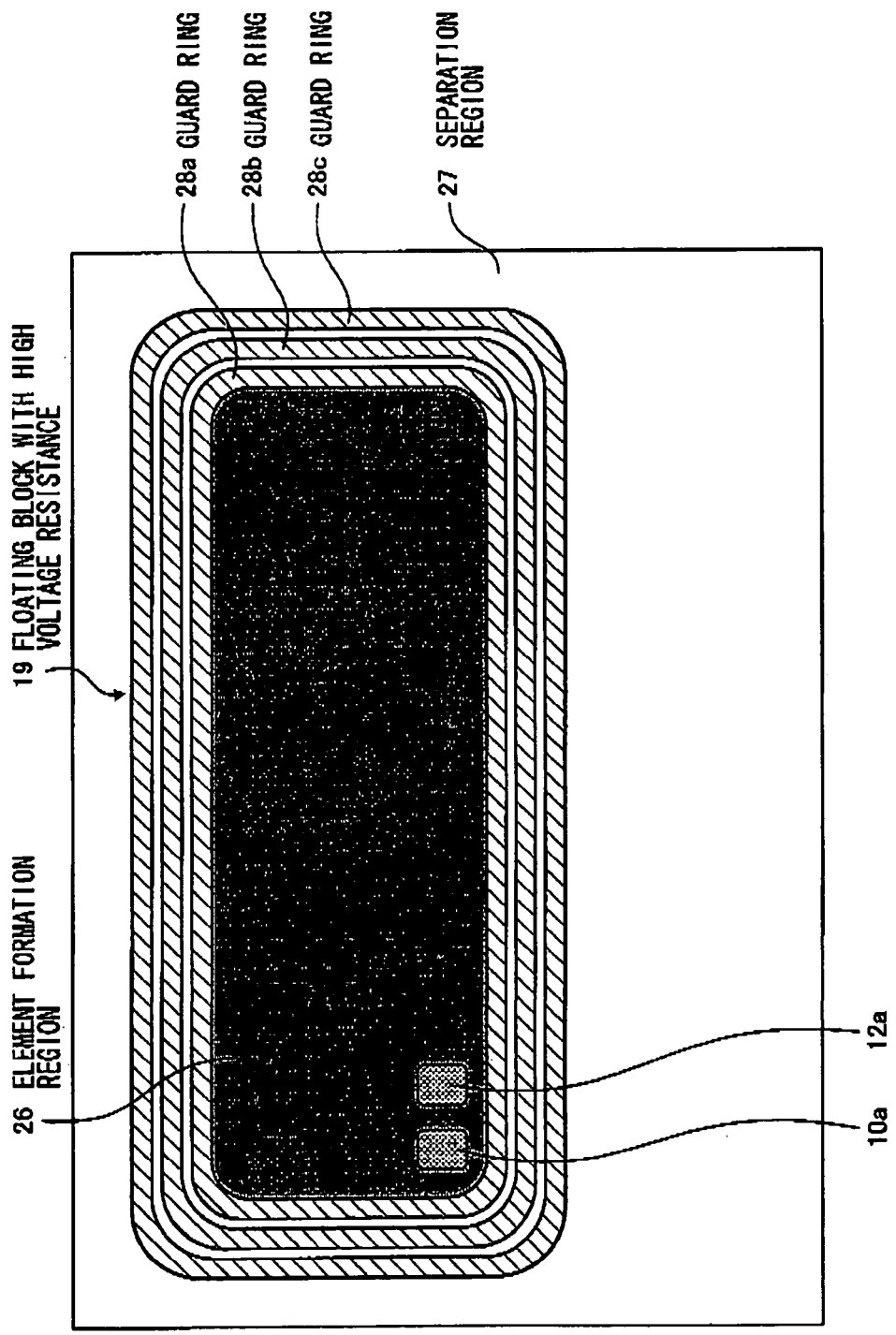
FIG. 2 is a plan view of a main portion of the semiconductor device according to the same embodiment.

FIG. 1 and FIG. 2 illustrate Embodiment 1 of the present invention.

FIG. 1 shows a semiconductor device for PDP signal processing that uses a sustain driver 102 comprising a boot strap circuit.

In the sustain driver shown in FIG. 1, an input circuit 1 and a level shift circuit 2 operate by using a power source voltage applied between a power source terminal VCC and a ground terminal GND.

A floating block 19 with a high voltage resistance is an island region of an N-type semiconductor configured inside a semiconductor substrate. A high-potential power source terminal. VB is connected to this island region, the island potential is biased by the voltage applied to the high-potential power source terminal and varies from a low potential (about 20 V) to a high potential (about 400 V). Further, a low-potential power source terminal VS serves for a signal processing circuit integrated inside the floating block 19 with a high voltage resistance.

A signal reception circuit 3, a protection circuit 7, a reference voltage circuit 17, and an output circuit 18 serving as a signal processing circuit are provided inside the floating block 19 with a high voltage resistance.

An input signal IN inputted via the input circuit 1 is inputted via the level shift circuit 2 into the signal reception circuit 3 located in the floating block 19 with a high voltage resistance. The output circuit 18 is driven by the output signal of the signal reception circuit 3 and outputs a high-voltage output signal from an output terminal HO.

The reference voltage circuit 17 is composed of a NPN bipolar transistor 10 serving as a first bipolar transistor connected by the collector and base to the high-potential power source terminal VB, a resistor 9 as a first resistor connected between the emitter of the NPN bipolar transistor 10 and the reference voltage output terminal, a NPN bipolar transistor 12 as a second bipolar transistor connected by the collector and base to the high-potential power source terminal VB, resistors 11, 14 as second and third resistors connected in series between the emitter of the NPN bipolar transistor 12 and the reference voltage output terminal, a CMOS differential amplifier 8 for comparing the potential difference of the potential of the intermediate connection point of the resistor 11 and resistor 14 and the emitter potential of the NPN bipolar transistor 10, a P-channel MOS transistor 16 for amplifying the output signal of the differential amplifier 8, and N-channel MOS transistors 15, 13.

The reference voltage circuit 17 is a constant-voltage circuit of the so-called band gap type and is so designed that the NPN bipolar transistors 10, 12 have different sizes, in particular different surface areas of emitters. The operation currents of the NPN bipolar transistors 10, 12 are also different.

A negative feedback loop is configured via the differential amplifier 8 and MOS transistors 16, 15, 13 and the circuit is so operated that the potential of the intermediate connection point of the resistors 11, 14 and the emitter potential of the NPN bipolar transistor 10 are balanced.

As a result, an output voltage (reference voltage Vref) stable against ambient temperature can be outputted. This reference voltage Vref is about 1.2 V and has practically no spread.

Further, because in the reference voltage circuit 17, the collectors of the NPN bipolar transistors 10, 12 are connected to the high-potential power source terminal VB of the floating block 19 with a high voltage resistance, the transistor active regions 10a, 12a of the NPN bipolar transistors 10, 12 can be formed together with other semiconductor elements inside the element formation region 26 of the floating block 19 with a high voltage resistance.

Therefore, even though guard rings specially designed for the NPN bipolar transistors 10, 12 are not provided, as shown in FIG. 2, the guard rings for the floating block 19 with a high voltage resistance can also serve for the NPN transistors and the high-side circuitry of the sustain driver comprising the signal reception circuit 3, output circuit 18, and reference voltage circuit 17 can be configured inside the floating block 19 with a high voltage resistance.

The protection circuit 7 is composed of resistors 5, 6 as fourth and fifth resistors connected in series between the high-potential power source terminal VB and low-potential power source terminal VS and a comparator 4 for comparing the difference in potential of the intermediate connection point of the resistors 5, 6 and the reference voltage Vref. If the voltage between the low-potential power source terminal VS and high-potential power source terminal VB increases, the output of the comparator 4 assumes a low level, the input signal of the output circuit 18 is shielded, and the output signal of the output circuit 18 is terminated. Then, a low level is outputted at the output terminal HO.

Figure 6A:
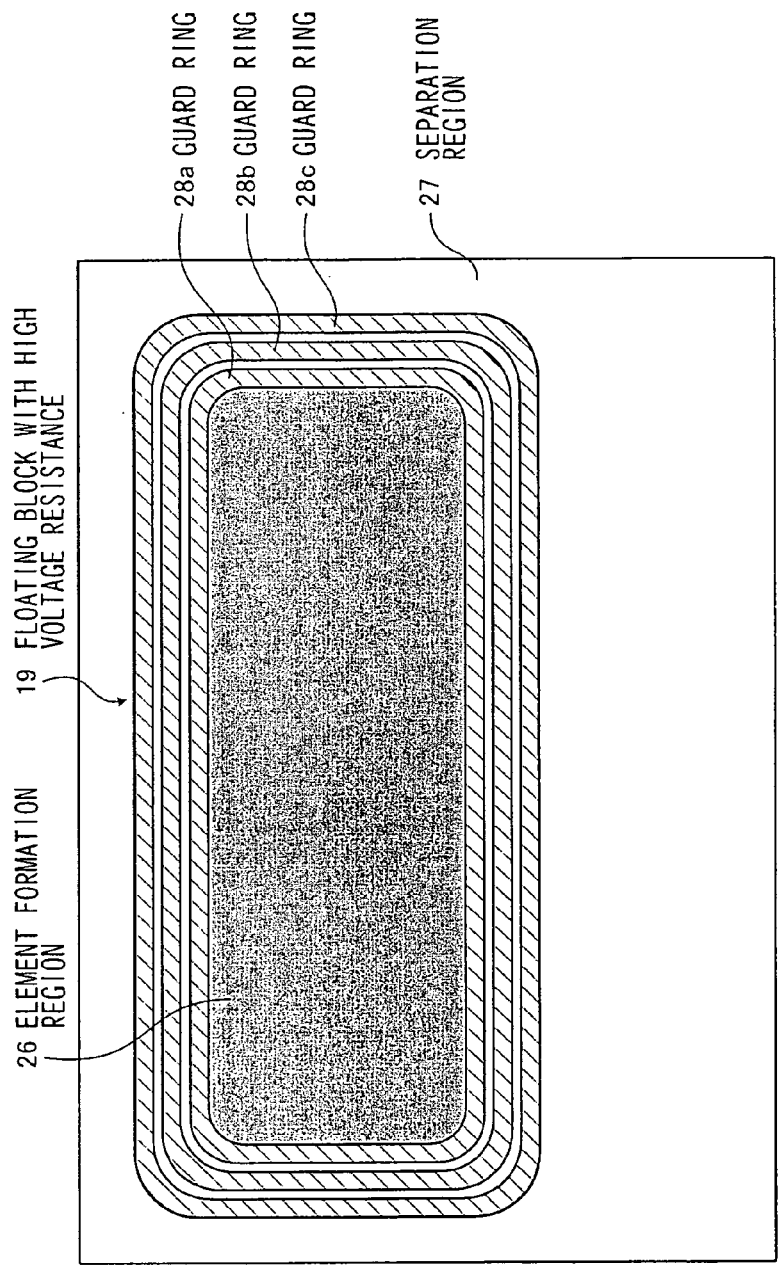
FIGS. 6A and 6B each is a plan view illustrating a configuration of a conventional semiconductor device.

An example of the semiconductor device with a high voltage resistance characteristic of 400 V will be described below. In the embodiment shown in FIG. 2, semiconductor elements such as MOS transistors, resistors, capacitors, and transistor active regions of bipolar transistors are formed in the element formation region 26. A signal processing circuit comprising the signal reception circuit 3, protection circuit 7, reference voltage circuit 17, and output circuit 18 is composed by those semiconductor elements. The number of semiconductor elements integrated in the element formation region is about 200, and a surface area of 1200 µm×400 µm is necessary to integrate those semiconductor elements. As for this surface area, the size of the element formation region 26 in FIG. 2 is the same as in the conventional example shown in FIG. 6A. The region surrounding the element formation region 26 in the floating block 19 with a high voltage resistance serves as a guard ring region, and three guard rings 28a, 28b, 28C are provided on the surface of this guard ring region.

When a large number of semiconductor elements are integrated in the prescribed region, they cannot be tightly integrated without leaving gaps therebetween, and with usual design procedures, the empty space where no semiconductor element is disposed is about 5 to 10%.

Figure 6B:
Figure 7:
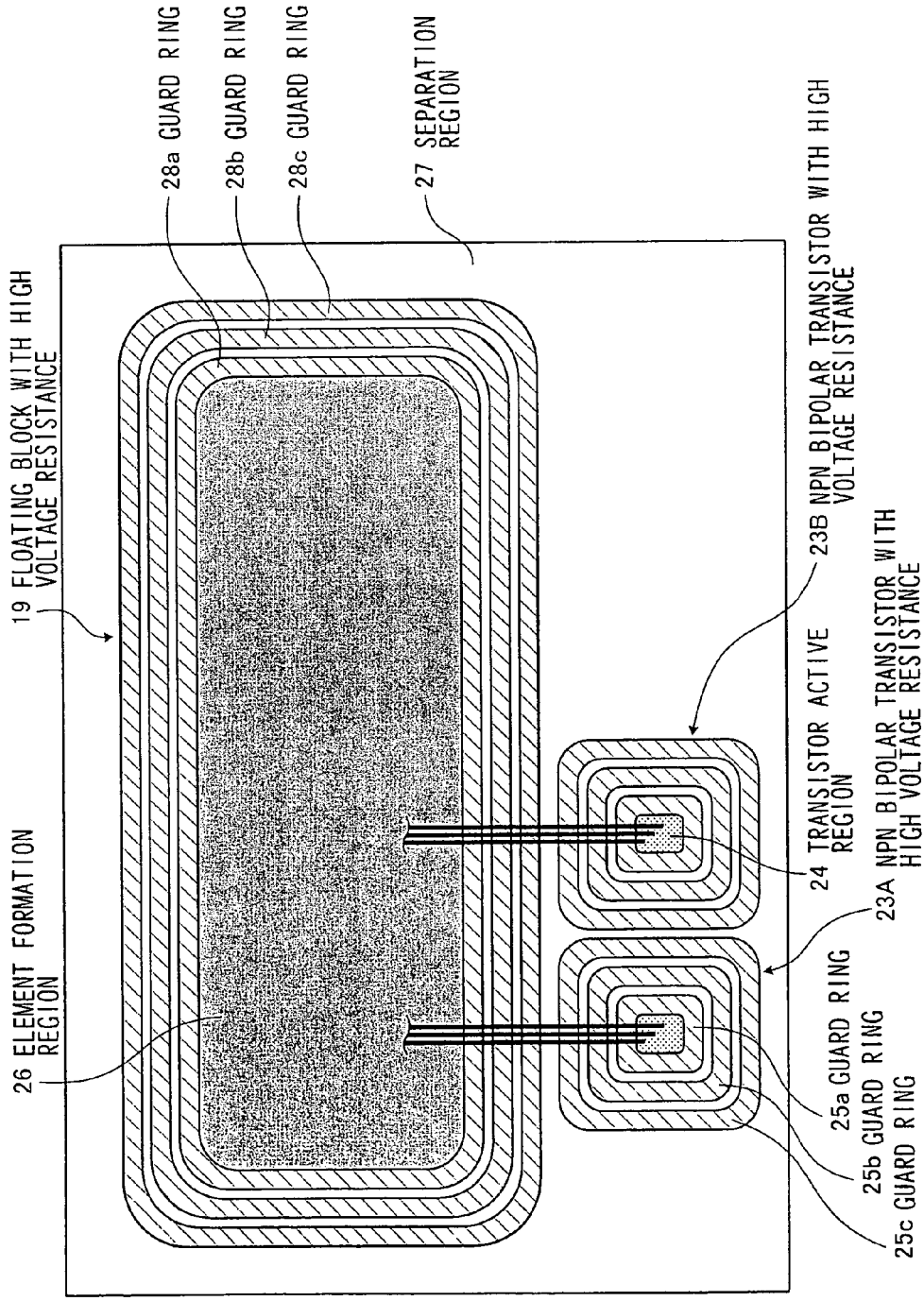
FIG. 7 is a plan view illustrating the conventional semiconductor device using two transistors with high voltage resistance.

On the other hand, the size of the transistor active region 24 of one NPN bipolar transistor is about 40 µm×60 µm, as shown in FIG. 6B. Therefore, the surface area occupied by one transistor active region 24 is about 0.5% surface area of the element formation region 26. Several such transistor active region with a small occupied surface area can be readily integrated in the empty space generated in the element formation region 26. Therefore, disposing the transistor active region 24 of NPN bipolar transistors 10, 12 inside the floating block 19 with a high voltage resistance makes it possible to reduce the increase in surface area with respect to that of the conventional configurations, and it is absolutely unnecessary to increase in advance the surface area of the element formation region 26, which has to be formed, in order to add the transistor active region.

Further, as a method for terminating the signal output from the output circuit 18, the supply of electric power from the low-potential power source terminal VS and high-potential power source terminal VB to the output circuit 18 may be cut off and terminated or the signal input to the signal reception circuit 3 may be cut off.

Further, the differential amplifier 8 in the above-described embodiment is a CMOS differential amplifier composed of MOS transistors, and the comparator 4 is composed of MOS transistors. A specific feature of those MOS transistors is that the circuit thereof can be configured without providing a separation and diffusion region for each unit.

With such a semiconductor device for a sustain driver, only the transistor active regions of bipolar transistors can be integrated together with other semiconductor elements inside a floating block with a high voltage resistance, without using bipolar transistors equipped with guard rings, and a highly accurate reference voltage circuit that can be integrated on a small surface area can be provided.

Further, when too high a voltage is detected, the input signals of the output circuit 18 can be cut off and the operation of the signal processing circuit can be terminated by the comparator 4 for comparing the reference voltage Vref outputted from the reference voltage circuit 17 and the voltage obtained by dividing the power source voltage. As a result, the signal processing circuit can be operated only at a voltage that is not higher than the power source voltage which provides for stable operation.

In the present embodiment, the explanation was provided based on the configuration in which three guard rings were used, but the number of guard rings may be increased in order to increase further the voltage resistance, or the number of guard ring may be reduced when a small voltage resistance is required.

(Embodiment 2)

Described hereinbelow is a semiconductor device comprising a protection circuit operating when the power source voltage drops.

The circuit of Embodiment 2 has a configuration almost identical to that shown in FIG. 1 (Embodiment 1), wherein the high-potential power source terminal voltage VB divided by the resistors 5, 6 is applied to the inverted input terminal (−) of the comparator 4 and the drain voltage of the MOS transistor 13 is applied to the non-inverted input terminal (+). As a result, when the voltage between the terminals of the resistor 5 becomes less than the reference voltage Vref, the comparator 4 can terminate the output of signal (Vout) processing circuit (output circuit 18) integrated in the floating block 19. In this case, it functions as a protection circuit for terminating the operation of the signal processing circuit before the power source voltage drops and becomes insufficient. However, the operation point of the power source voltage has to be changed by making the resistance of the resistor 5 and resistor 6 of the present embodiment different from the resistance of the resistor 5 and resistor 6 of Embodiment 1. With respect to integrating the circuit of this type in the floating block 19, the effect identical to that of Embodiment 1 can be expected.

Further, a high-side circuit operating with good stability in the prescribed power source voltage range can be configured by using the circuit protecting against the voltage drop, which was explained in the present embodiment, and the circuit protecting against over-voltage, which was described in Embodiment 1.

(Embodiment 3)

A semiconductor device comprising a circuit protecting against heating will be described with reference to FIG. 3.

Figure 3:
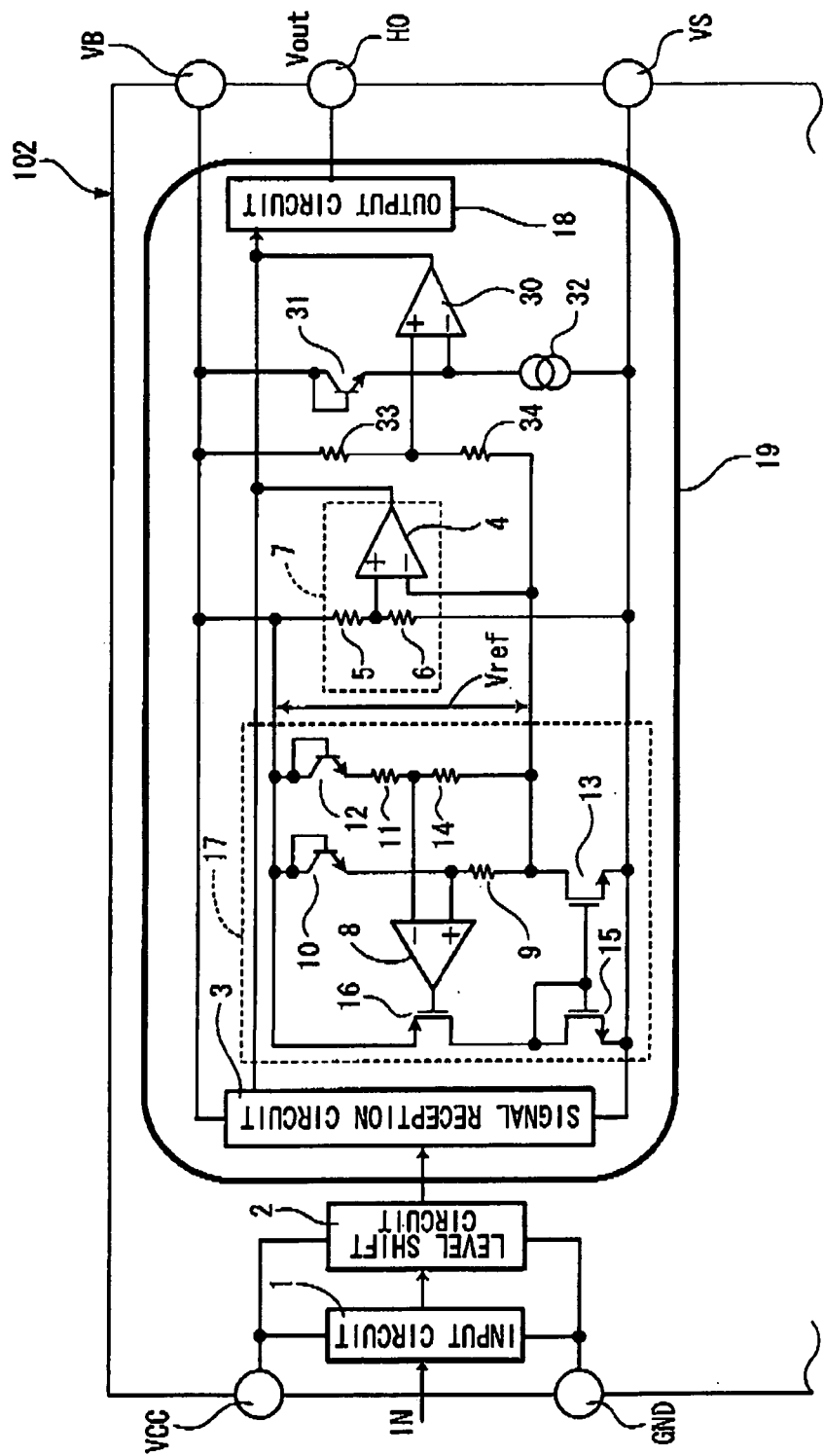
FIG. 3 is a circuit diagram of a semiconductor device for a sustain drive according to (Embodiment 2) of the present invention.
Figure 4:
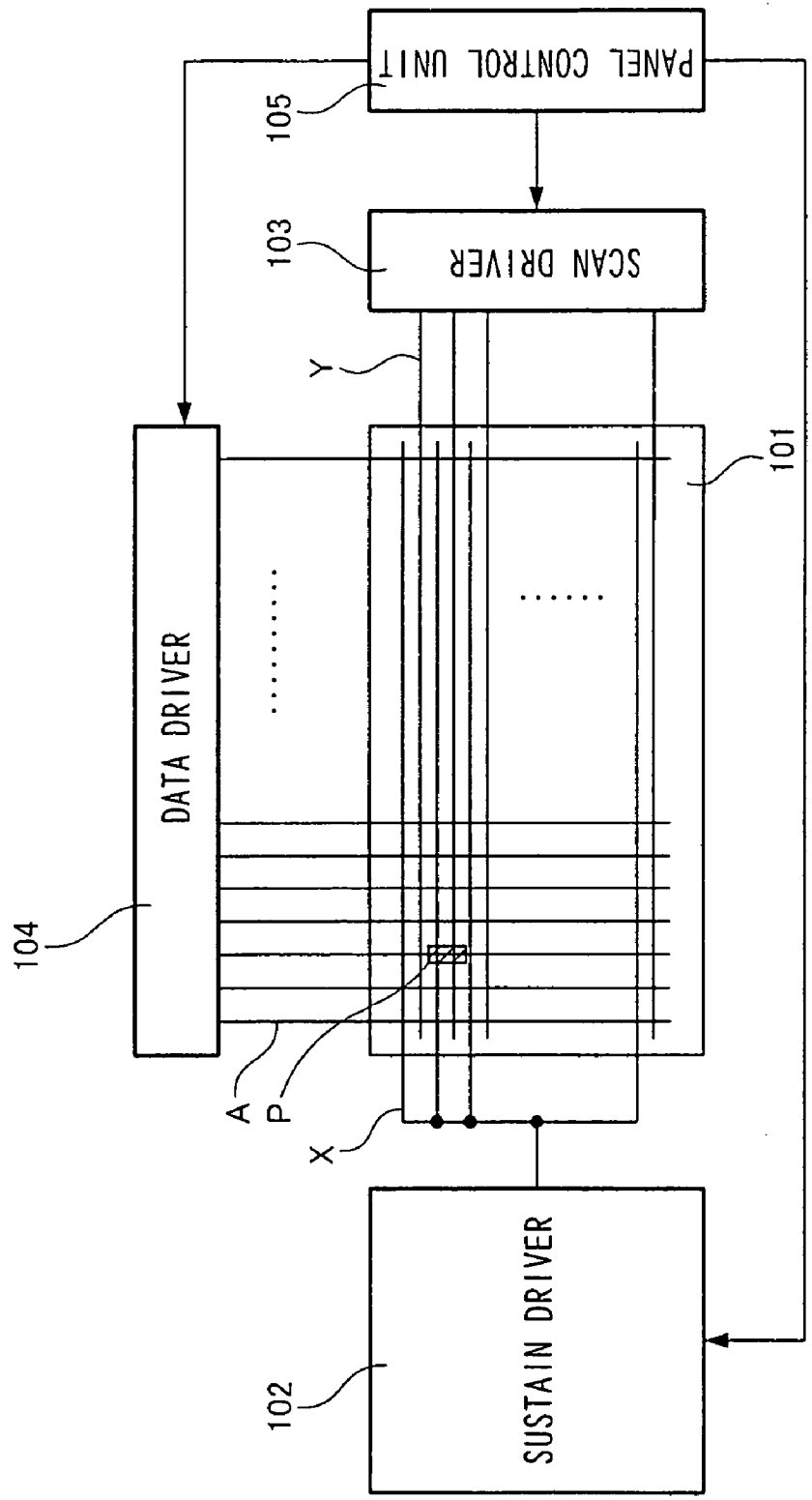
FIG. 4 shows a general configuration of a plasma display device.
Figure 5:
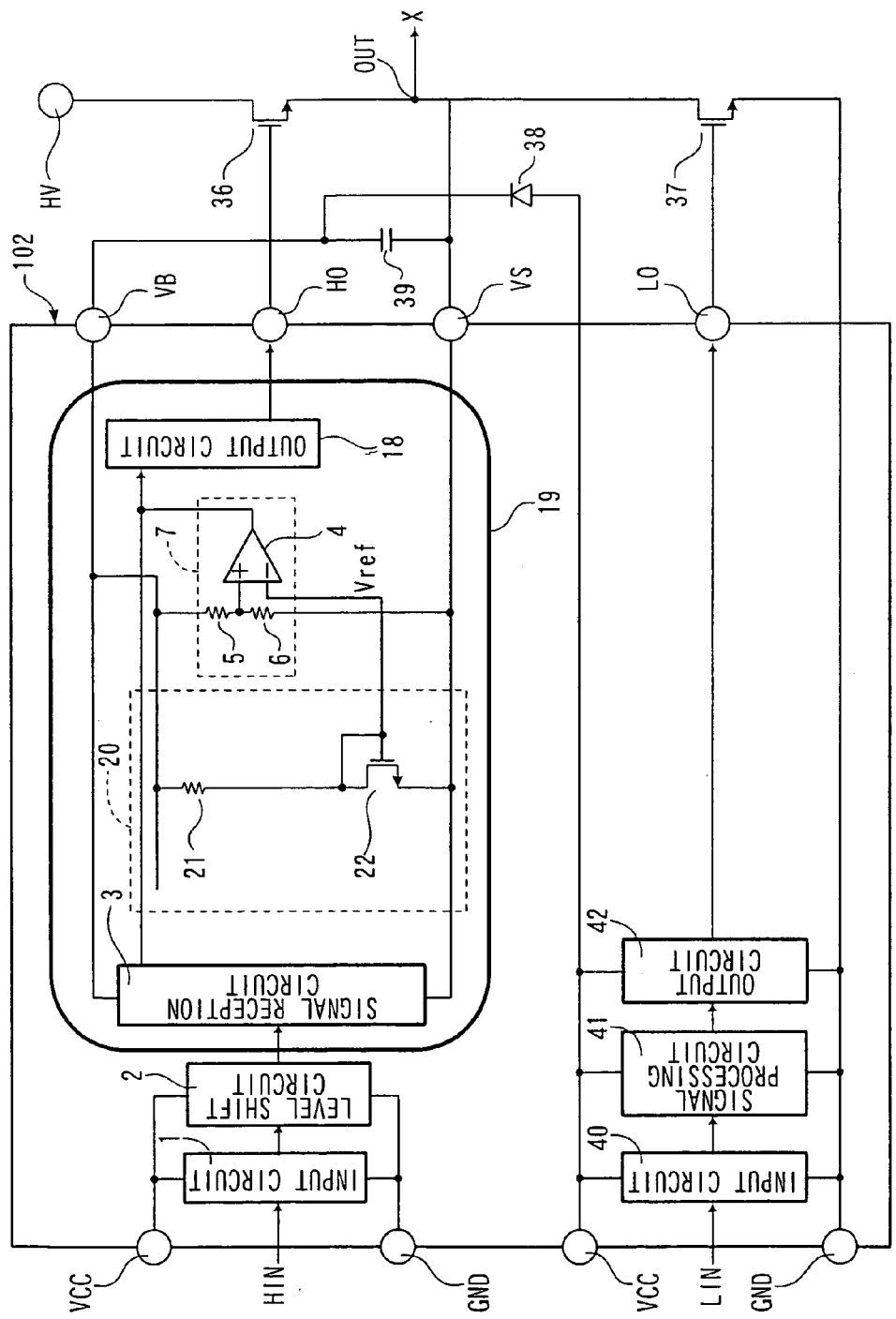
FIG. 5 is a circuit diagram of a sustain drive and peripherals thereof according to a conventional art.

FIG. 3 shows the circuit configuration of Embodiment 3 of the present invention. The explanation of the signal reception circuit 3, reference voltage circuit 17, protection circuit 7 for protection against over-voltage, and output circuit 18 will be omitted.

The above-mentioned reference voltage Vref is resistance divided by the serial circuit of a resistor 33 and a resistor 34 connected to the reference voltage circuit 17, and the prescribed voltage corresponding to the operation point at the detected temperature is set. The collector and base of a bipolar transistor 31 are connected to a high-potential power source terminal VB and the emitter of the bipolar transistor 31 is connected to one terminal of a constant-current source 32 to supply a constant current. Further, the inverted input terminal (−) of a comparator 30 is connected to the emitter of the bipolar transistor 31, an intermediate connection point of the resistor 33 and resistor 34 is connected to the non-inverted input terminal (+), and the output of comparator 30 is connected to the input of an output circuit 18. The voltage between the base and emitter of the bipolar transistor 31 has a temperature coefficient of −2 mV/° C. and this voltage decreases with the increase in temperature. Because the absolute value of the voltage between the base and emitter differs depending on diffusion process conditions, the detection voltage corresponding to the detected temperature is found empirically. The reference voltage Vref is divided with the serial circuit of the resistor 33 and resistor 34, so that the voltage between the terminals of the resistor 33 becomes the detection voltage.

With such a configuration, when the ambient temperature rises and exceeds the allowed operation range, the input signal of the output circuit 18 is cut off, the output signal (Vout) of the output circuit 18 is terminated, and a low level is outputted to the output terminal HO by the output of the comparator 30 that compares the prescribed voltage set based on the reference voltage Vref with the voltage between the base and emitted of the third bipolar transistor 31 having its collector and base connected to the high-potential power source terminal VB and its emitter connected to the constant current source 32. Thus, when the ambient temperature rises and normal operation cannot be ensured, the output signal for driving the power switching element via the output terminal HO is cut off and the power switching element can be protected against a thermal breakdown.

In the above-described embodiments, output MOS transistors 36, 37 were used as the power switching elements, but the same effect is obtained when insulated gate bipolar transistors are used.

In the above-described embodiments, the input signal of the output circuit 18 was cut off and the output signal of the output circuit 18 was terminated by the output of the comparator 4 or comparator 30. However, the output of the comparator 4 or comparator 30 may be also used to cut off the input signal of the signal reception circuit 3 and to cut off the supply of power to the signal reception circuit 3 of output circuit 18. Essentially, identical effect can be obtained by terminating the operation of the signal processing circuit integrated in the floating block 19.

The present invention makes contribution to size reduction and reliability increase of various semiconductor devices comprising a floating block and can be used in semiconductor devices for signal processing in flat displays such as plasma displays.

What is claimed is:

1. A semiconductor device comprising:
    a high-potential power source terminal to be applied with a power source voltage varying from a low potential to a high potential;
    a floating block configured as an island by surrounding a semiconductor layer formed on a semiconductor substrate with a separation-and-diffusion region, the potential of the island being biased by the voltage of said high-potential power source terminal;
    a MOS transistor having a source connected to a low-potential power source terminal and outputting a reference voltage between said high-potential power source terminal and a drain;
    first and second bipolar transistors having collectors and bases connected to said high-potential power source terminal;
    a first resistor connected between the emitter of said first bipolar transistor and the drain of said MOS transistor;
    second and third resistors connected in series between the emitter of said second bipolar transistor and the drain of said MOS transistor; and
    a differential amplifier for controlling conduction of said MOS transistor by comparing an intermediate connection point of said second and third resistors and the emitter potential of said first bipolar transistor, wherein the transistor active region of said first and second bipolar transistors, said MOS transistor, and said first to third resistors are formed within said floating block.

2. The semiconductor device according to claim 1, wherein said floating block has a central portion thereof as an element formation region, guard rings are formed so as to surround the outer periphery of said element formation region.

3. The semiconductor device according to claim 1, further comprising fourth and fifth resistors connected in series between said low-potential power source terminal and said high-potential power source terminal, and a comparator for comparing a drain potential of said MOS transistor and a potential at an intermediate connection point created by said fourth and fifth resistors, wherein an output signal of a signal processing circuit integrated in the element formation region within said floating block is terminated by an output of said comparator.

4. The semiconductor device according to claim 1, further comprising a third bipolar transistor having a constant-current source connected to the emitter, and a collector and base connected to said high-potential power source terminal, and a second comparator for comparing a voltage between the base and emitter of said third bipolar transistor with a prescribed voltage based on the reference voltage, wherein an output signal of a signal processing circuit integrated in the element formation region within said floating block is terminated by an output of said second comparator.

* * * * *